(12) United States Patent
Turullols et al.

(10) Patent No.: US 8,604,852 B1
(45) Date of Patent: Dec. 10, 2013

(54) NOISE SUPPRESSION USING AN ASYMMETRIC FREQUENCY-LOCKED LOOP

(75) Inventors: Sebastian Turullols, Los Altos, CA (US); Changku Hwang, Morgan Hill, CA (US); Daniel Woo, San Francisco, CA (US); Yifan YangGong, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/610,469

(22) Filed: Sep. 11, 2012

(51) Int. Cl.
*H03L 7/06* (2006.01)

(52) U.S. Cl.
USPC .............................. 327/159; 327/298; 327/262

(58) Field of Classification Search
USPC ................. 327/298, 158–159, 156, 175–177, 327/47–49, 72, 91, 142–143, 262, 327/291–294; 331/2, 17, 23, 175, 176; 713/322, 340
See application file for complete search history.

(56) References Cited

U.S. PATENT DOCUMENTS

2010/0244903 A1* 9/2010 Easton et al. ................. 327/105
2011/0068841 A1* 3/2011 Huang et al. ................. 327/156

* cited by examiner

*Primary Examiner* — Lincoln Donovan
*Assistant Examiner* — Thomas Skibinski
(74) *Attorney, Agent, or Firm* — Park, Vaughan, Fleming & Dowler LLP; Steven E. Stupp

(57) ABSTRACT

In an integrated circuit that provides a clock signal, an asymmetric frequency-locked loop (AFLL) includes a first digitally controlled oscillator (DCO) that outputs a first signal having a first fundamental frequency, and a second DCO that outputs a second signal having a second fundamental frequency that is less than the first fundamental frequency. Moreover, the AFLL includes control logic that selects one of the first DCO and the second DCO based on an instantaneous value of a power-supply voltage and an average power-supply voltage so that an impact of power-supply voltage variations on a time-critical path in the integrated circuit is reduced. For example, the control logic may select the first DCO if the instantaneous value of the power-supply voltage is greater than the average power-supply voltage; otherwise, the control logic may select the second DCO.

20 Claims, 9 Drawing Sheets

NOISE SUPPRESSION USING AN ASYMMETRIC FREQUENCY-LOCKED LOOP

BACKGROUND

1. Field

The present disclosure generally relates to an integrated circuit with an adjustable clock frequency. More specifically, the present disclosure relates to an integrated circuit that includes an asymmetric frequency-locked loop (AFLL), which includes digitally controlled oscillators (DCOs), and which adjusts a clock frequency of a critical path based on variations in a power-supply voltage of the DCOs and the critical path.

2. Related Art

The operating frequency of an integrated circuit is typically specified at the lowest acceptable power-supply voltage (Vlow) for a critical path in the integrated circuit, i.e., the power-supply voltage for which the critical path has a non-zero timing margin. In addition, the power dissipation or power consumption of the integrated circuit is usually specified at the average power-supply voltage (Vnominal).

In general, clock-generating circuits on integrated circuits are designed to be stable and not to track variations in the power-supply voltage, such as changes associated with power-supply noise. Thus, ideally there is a fixed difference between Vnominal and Vlow during operation of the integrated circuit.

However, in practice the power-supply voltage usually decreases when there is an increase in the power consumption of the integrated circuit. In particular, when there is a transient increase in the power-supply current, the inductance (L) through a chip package of the integrated circuit can result in a voltage loss $$\left(L\frac{di}{dt}\right).$$

This voltage loss can result in a failure on the critical path because of an insufficient timing margin caused by the drooped voltage.

In addition, the combination of the inductance L and on-chip capacitances can produce a resonance frequency between 50-100 MHz that also produces oscillations in the power-supply voltage. This is shown in FIG. 1, which illustrates an electronic resonance associated with the chip package of an existing integrated circuit. Note that, if the power-supply voltage drops below Vlow, the critical path in this integrated circuit may fail because of an insufficient timing margin.

As critical dimensions in integrated circuits continue to decrease, the sensitivity of integrated circuits to these power-supply effects increases. Notably, smaller critical dimensions are typically associated with higher clock frequencies (and smaller clock periods), which increases power consumption and, thus, increases voltage droop. Furthermore, as the clock frequency increases, the resonance frequency associated with the chip package may fall within the operating bandwidth of the integrated circuit and, thus, of the power-supply distribution system. (However, note that the voltage variations associated with this resonance are typically at too high a frequency to be addressed by a voltage regulator module in the power-supply distribution system.) Collectively, these effects may require additional voltage margin to be added when designing the integrated circuit to ensure proper operation, which may be prohibitive in terms of the cost, complexity and time to market of the integrated circuit.

Hence, what is needed is an integrated circuit without the above-described problems.

SUMMARY

One embodiment of the present disclosure provides an integrated circuit that provides a clock signal. In particular, this integrated circuit includes a first sub-frequency-locked loop in an asymmetric frequency-locked loop (AFLL) that includes: a first digitally controlled oscillator (DCO) that outputs a first signal having a first fundamental frequency; and a second DCO that outputs a second signal having a second fundamental frequency, where the second fundamental frequency is less than the first fundamental frequency. Moreover, the AFLL includes control logic that selects one of the first DCO and the second DCO based on an instantaneous value of a power-supply voltage and an average power-supply voltage, where the selected DCO reduces an impact of power-supply voltage variations on a time-critical path in the integrated circuit.

Note that the control logic selects the first DCO if the instantaneous value of the power-supply voltage is greater than the average power-supply voltage, and the control logic selects the second DCO if the instantaneous value of the power-supply voltage is less than the average power-supply voltage. The selected DCO may prevent timing failures on the time-critical path associated with power-supply voltage droop without reducing the period of the clock signal during power-supply voltage overshoot.

In some embodiments, the integrated circuit further includes a second sub-frequency-locked loop in the AFLL. During a given time interval, one of the first sub-frequency-locked loop and the second sub-frequency-locked loop is enabled. Moreover, during successive time intervals, the integrated circuit alternates operation between the first sub-frequency-locked loop and the second sub-frequency-locked loop.

Note that the integrated circuit may perform an auto-calibration procedure. During the auto-calibration procedure of a given sub-frequency-locked loop, which can include one of the first sub-frequency-locked loop and the second sub-frequency-locked loop, the control logic may: adjust a delay in at least one of the first DCO and the second DCO so that the first DCO and the second DCO have the same dynamic range; and ensure that, at the average power-supply voltage, the first DCO and the second DCO are locked to the same target frequency so that, at the average power-supply voltage, the first fundamental frequency approximately equals the second fundamental frequency. While this auto-calibration procedure is occurring, the other instance of the sub-frequency-locked loop may provide the clock signal.

Furthermore, the AFLL may include a first feedback loop that includes the first DCO and a second feedback loop that includes the second DCO. During the auto-calibration procedure, the control logic may enable the first feedback loop and the second feedback loop. Additionally, the control logic may disable the first feedback loop and the second feedback loop so that a selected DCO operates open loop.

Note that, after the auto-calibration procedure, the first DCO may have approximately the same delay as the second DCO at the average power-supply voltage.

In some embodiments, a given feedback loop, which can include one of the first feedback loop and the second feedback loop, includes a DCO associated with a time-critical path having a wire-dominated delay characteristic, and another DCO associated with a time-critical path having a gate-dominated delay characteristic. During the auto-calibration procedure, the control logic selects one of the DCO and the other DCO. Therefore, either the first DCO or the second DCO may, respectively, be associated with the time-critical path having a wire-dominated delay characteristic or the time-critical path having a gate-dominated delay characteristic.

In some embodiments, the AFLL includes at least one switched capacitor network that specifies a relative delay of the first DCO and the second DCO. During the auto-calibration procedure, the control logic may adjust the switched capacitor network so that the first DCO and the second DCO have the same dynamic range.

The power-supply voltage variations may be associated with an inductance of the chip package that includes the integrated circuit and a time varying power-supply current.

Another embodiment provides an electronic device that includes the integrated circuit.

Another embodiment provides a method for operating the AFLL that provides the clock signal. During operation, the AFLL determines a power-supply voltage condition based on the instantaneous value of the power-supply voltage and the average power-supply voltage. Then, the AFLL selects one of the first DCO and the second DCO in the AFLL based on the power-supply voltage condition, where the first DCO outputs the first signal having the first fundamental frequency and the second DCO outputs the second signal having the second fundamental frequency. Note that the second fundamental frequency is less than the first fundamental frequency, and the selected DCO reduces an impact of power-supply voltage variations on a time-critical path in the integrated circuit.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, an electronic device that includes the integrated circuit, and a method for providing a clock signal are described. In the integrated circuit, an asymmetric frequency-locked loop (AFLL) includes a first digitally controlled oscillator (DCO) that outputs a first signal having a first fundamental frequency, and a second DCO that outputs a second signal having a second fundamental frequency that is less than the first fundamental frequency. Moreover, the AFLL includes control logic that selects one of the first DCO and the second DCO based on an instantaneous value of a power-supply voltage and an average power-supply voltage so that an impact of power-supply voltage variations on a time-critical path in the integrated circuit is reduced. For example, the control logic may select the first DCO if the instantaneous value of the power-supply voltage is greater than the average power-supply voltage, and the control logic may select the second DCO if the instantaneous value of the power-supply voltage is less than the average power-supply voltage.

By selecting the DCO, this integrated circuit may compensate for power-consumption-induced power-supply voltage changes. In particular, the AFLL may prevent timing failures on the time-critical path associated with power-supply voltage droop without reducing the period of the clock signal during power-supply voltage overshoot. In this way, the fundamental frequency of the clock signal may be reduced when the power-supply voltage droops because of increased power consumption, thereby slowing the integrated circuit down and preventing failure of the critical path because of insufficient evaluation time at the drooped power-supply voltage. Furthermore, by slowing the integrated circuit down, this clock-frequency adjustment technique may reduce the power consumption, thereby reducing the droop in the power-supply voltage. (In effect, the timing and voltage margins of the integrated circuit may be increased.) Collectively, relative to existing integrated circuits, the clock-frequency adjustment technique may reduce the cost, complexity and time to market of the integrated circuit, as well as improve its performance.

Figure 1:
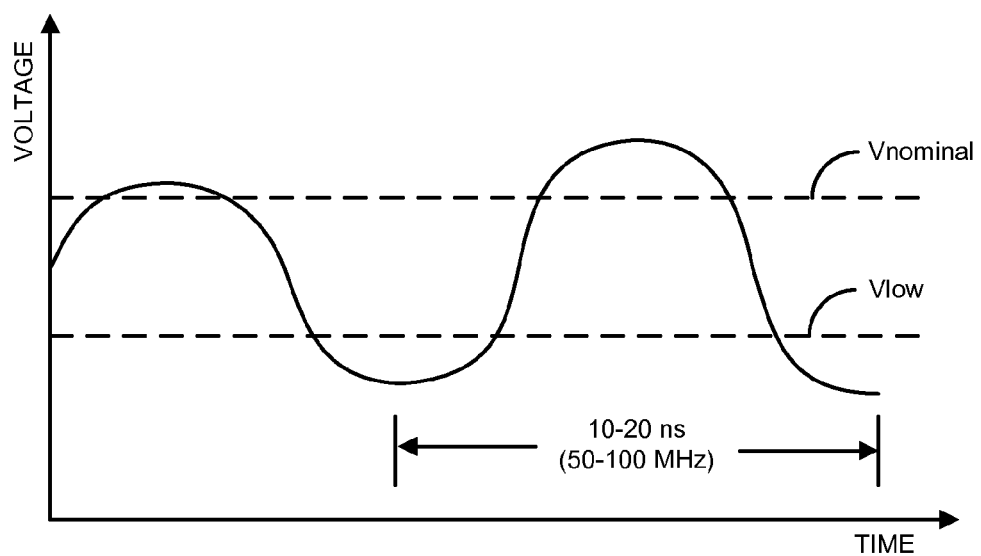
FIG. 1 is a drawing illustrating an electronic resonance associated with a chip package of an existing integrated circuit.
Figure 2:
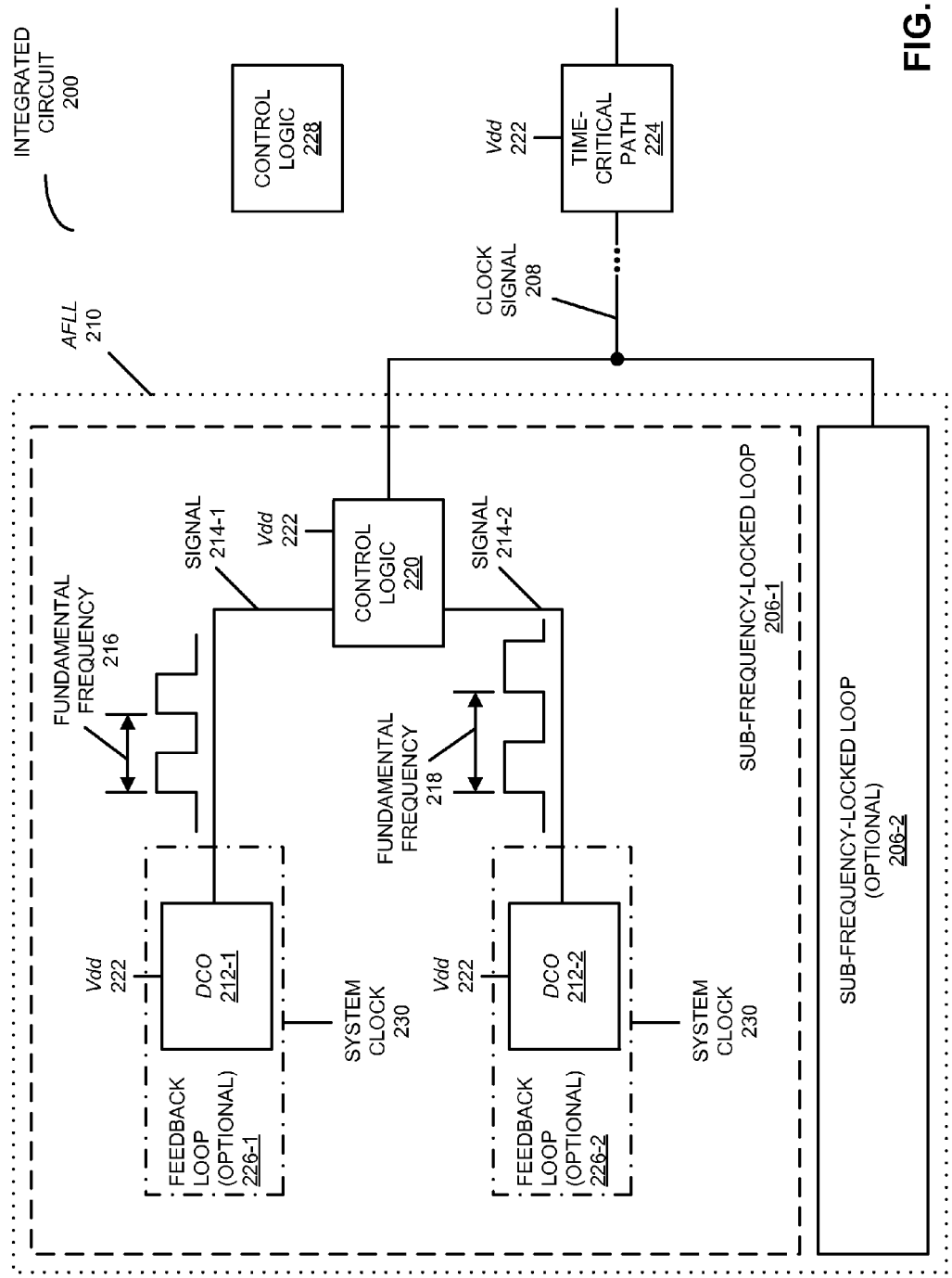
FIG. 2 is a block diagram illustrating an integrated circuit in accordance with an embodiment of the present disclosure.

We now describe embodiments of the integrated circuit. FIG. 2 presents a block diagram illustrating an integrated circuit 200 that provides a clock signal 208, such as a clock of a global clock-distribution tree, which includes a time-critical path 224 of integrated circuit 200. This integrated circuit includes an asymmetric frequency-locked loop (AFLL) 210 that includes sub-frequency-locked loop 206-1, which includes: digitally controlled oscillator (DCO) 212-1 that outputs signal 214-1 having fundamental frequency 216; and DCO 212-2 that outputs signal 214-2 having fundamental frequency 218, where fundamental frequency 218 is less than fundamental frequency 216. Moreover, AFLL 210 includes control logic 220 that selects one of DCO 212-1 and DCO 212-2 based on an instantaneous value of power-supply voltage (Vdd) 222 (i.e., the on-chip power supply) and an average Vdd. (Vdd 222 is provided by a power-distribution system, which is not shown.) For example, control logic 220 may select DCO 212-1 if Vdd 222 is greater than average Vdd, and control logic 220 may select DCO 212-2 if Vdd 222 is less than average Vdd. In some embodiments, control logic 220 includes a Muller C-element, with signals 214 as inputs, and outputs the input signal with the lower frequency.

Note that the selected DCO may reduce an impact of power-supply voltage variations on time-critical path 224 in integrated circuit 200, such as a half-clock-cycle time-critical path or a full-clock-cycle time-critical path. These power-supply voltage variations may be associated with an inductance of the chip package that includes integrated circuit 200 and a time varying power-supply current, such as Ldi/dt induced power-supply voltage noise. Moreover, the selected DCO may prevent timing failures on time-critical path 224 associated with power-supply voltage droop without reducing the period of clock signal 208 during power-supply voltage overshoot. Thus, AFLL 210 may have a different response to power-supply voltage undershoot and overshoot. In some embodiments, clock signal 208 output by AFLL 210 may slow down during a power-supply voltage undershoot (such as 20% slower for a 50 mV power-supply voltage droop) but may not speed up (or may not speed up at the same rate) during a power-supply voltage overshoot. AFLL 210 may provide improved time margin in the presence of power-supply voltage noise.

In some embodiments, integrated circuit 200 further includes optional sub-frequency-locked loop 206-2. During a given time interval, one of sub-frequency-locked loop 206-1 and optional sub-frequency-locked loop 206-2 is enabled. Moreover, during successive time intervals, integrated circuit 200 (for example, control logic 228) alternates operation between sub-frequency-locked loop 206-1 and optional sub-frequency-locked loop 206-2. This may allow integrated circuit 200 to correct for drift associated with process, power-supply voltage and/or temperature variations.

Note that integrated circuit 200 may perform an auto-calibration procedure, such as every 100 μs. During the auto-calibration procedure of a given instance of the sub-frequency-locked loop, which can include one of sub-frequency-locked loop 206-1 and optional sub-frequency-locked loop 206-2, control logic 220 may: adjust a delay in at least one of DCO 212-1 and DCO 212-2 so that DCO 212-1 and DCO 212-2 have the same dynamic range; and ensure that, at average Vdd, DCO 212-1 and DCO 212-2 are locked to the same target frequency so that, at average Vdd, fundamental frequency 216 approximately equals fundamental frequency 218. In addition, after the auto-calibration procedure, DCO 212-1 may have approximately the same delay as DCO 212-2 at average Vdd. This auto-calibration procedure may ensure continuity in clock signal 208 when control logic 220 switches the selected DCO at average Vdd. Note that during the auto-calibration procedure, the other instance of the sub-frequency-locked loop may provide clock signal 208.

AFLL 210 may include optional feedback loop 226-1 that includes DCO 212-1 and optional feedback loop 226-2 that includes DCO 212-2. Therefore, optional feedback loops 226 may each constitute a frequency-locked loop (FLL). In an exemplary embodiment, signals 214 (FIG. 2) output by optional feedback loops 226 may have fundamental frequencies 216 and 218 between 500 MHz and approximately 6 GHz at an average Vdd between 0.7 at 1.1 V. During the auto-calibration procedure, control logic 220 may enable optional feedback loops 226. For example, as noted previously, optional feedback loop 226-1 and optional feedback loop 226-2 may be enabled in a round-robin fashion during the auto-calibration procedure. Each of optional feedback loops 226 may be relocked every 6 μs. Additionally, control logic 220 may disable optional feedback loops 226 (such as after the auto-calibration procedure) so that a selected DCO operates open loop during normal operation of integrated circuit 200.

Figure 3:
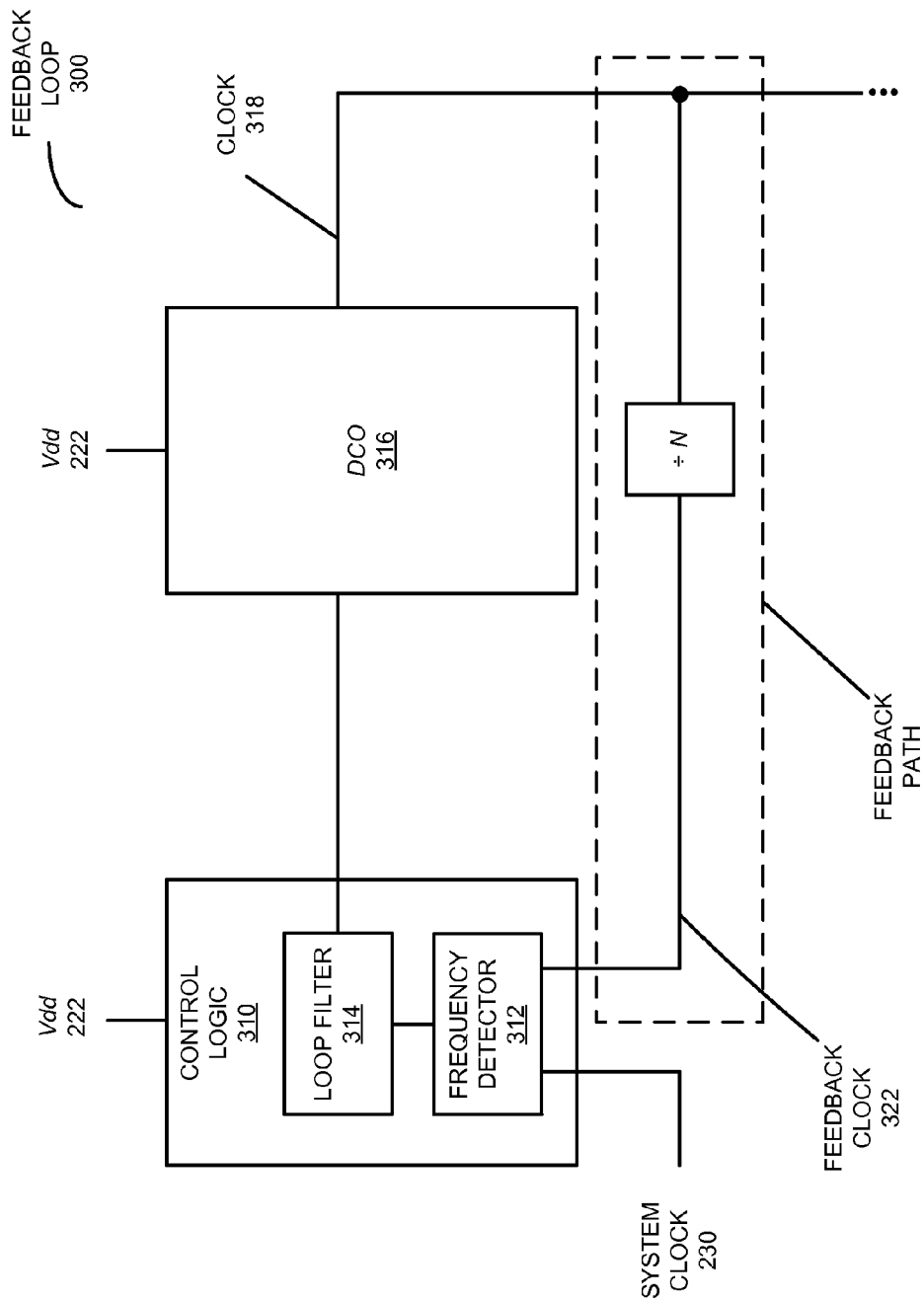
FIG. 3 is a block diagram illustrating a feedback loop in the integrated circuit of FIG. 2 in accordance with an embodiment of the present disclosure.

FIG. 3 presents a block diagram illustrating a feedback loop 300 (which is sometimes referred to as a 'feedback control loop') in integrated circuit 200 (FIG. 2). This feedback loop may be an all-digital clock generator that improves clock jitter and timing margins in response to power-supply variations (and, thus, it may also improve power-supply margins).

Feedback loop 300 may determine the low-frequency response (such as at frequencies less than 1 MHz) of DCO 316, which may be one of DCOs 212 in FIG. 2. In particular, in feedback loop 300 control logic 310 may determine the frequency difference between the frequency of feedback clock 322 provided by feedback path 320 and the frequency of system clock 230 or a frequency reference (such as 133 MHz and, more generally, 100-200 MHz) using a frequency detector 312 that counts how many periods of feedback clock 322 there are in a period of system clock 230. Then, based on the determined frequency difference, loop filter 314 drives control input or signals to DCO 316 (such as one of DCOs 212 in FIG. 2) so that the average frequency of clock signal 318 is a multiple N (such as an integer) of the frequency of system clock 230. Note that loop filter 314 may have a transfer characteristic that approximates that of a low-pass filter. Furthermore, a bandwidth of feedback loop 300 (and, thus, its operating frequency) may be controlled as desired in discrete binary steps by a simple digital shift of a counter output from down at the bandwidth of the voltage regulator module (approximately 10 kHz) up to the chip-package resonance frequency (50-100 MHz).

At high frequencies (such as at frequencies greater than 1 MHz), the DCO frequency (i.e., the clock frequency) is modulated by Vdd 222. As Vdd 222 increases, the clock frequency may increase, and as Vdd 222 decreases, the clock frequency may decrease. In addition, as described further below with reference to FIG. 5, the amount of modulation may be based on the programmed delay versus the power-supply voltage sensitivity of DCO 316, which may be selected to match the power-supply sensitivity (e.g., the time-delay sensitivity versus Vdd 222) of a manufactured time-critical path in integrated circuit 200 in FIG. 2. Thus, in response to power-supply noise, clock signal 208 may slow down as much as time-critical path 224 in FIG. 2 does.

Referring back to FIG. 2, from an alternative perspective the response time of DCOs 212 may be faster than (i.e., less than) or approximately equal to that of time-critical path 224, so that either or both match how this time-critical path responds to variations in Vdd 222 in a clock cycle. For example, power-supply noise may move or propagate across integrated circuit 200 via the power-supply distribution system (e.g., it may be driven by the voltage regulator module through board traces) in approximately one clock cycle. DCOs 212 may respond to this power-supply-voltage variation in approximately one clock cycle. Additionally, changes to the clock frequency output by the selected DCO may propagate back to time-critical path 224 in approximately 1-2 clock cycles. Typically, it is desirable that the DCO response occur within a quarter of a cycle of the resonance frequency associated with the chip package (in total, some 4-5 cycles of the clock frequency, i.e., very fast).

Because DCOs 212 are powered exclusively by the same power-supply voltage as time-critical path 224, variations in instantaneous Vdd 222 will modulate their output fundamental frequencies 216 and 218. In conjunction with the DCO selected by control logic 220, these changes to the fundamental frequency occur quickly (within a few clock cycles so there is no timing failure in time-critical path 224) and, during the auto-calibration procedure, may be subsequently slowly adjusted at the operating frequency by the corresponding one of optional feedback loops 226 to match system clock 230. In this way, the period of clock signal 208 tracks the power-supply-induced variation in the delay through time-critical path 224, thereby reducing or eliminating the impact of the resonance frequency and/or power-supply voltage droop. For example, when Vdd 222 droops, DCO 212-2 may run more slowly. The slower clock may prevent time-critical path 224 from failing. In addition, slowing down also reduces the power consumption, thereby reducing the power-supply voltage droop. Alternatively, when Vdd 222 overshoots, DCO 212-1 may run faster, thereby giving correction in the other direction. On average (such as over a micro-second), the fundamental frequency of clock signal 208 matches that of system clock 230, but it can move around to track the oscillations in Vdd 222 associated with the resonance frequency. Furthermore, power-supply variation is decreased because circuit activity may increase at high instantaneous values of Vdd 222 and may decrease at low instantaneous values of Vdd 222.

In some embodiments, a given feedback loop, which can include optional feedback loop 226-1 or optional feedback loop 226-2, includes a DCO associated with a time-critical path having a wire-dominated delay characteristic, and another DCO associated with a time-critical path having a gate-dominated delay characteristic. During the auto-calibration procedure, control logic 220 selects one of the DCO and the other DCO. Therefore, either DCO 212-1 or DCO 212-2 may, respectively, be associated with the time-critical path having a wire-dominated delay characteristic or the time-critical path having a gate-dominated delay characteristic. For example, the wire-dominated delay characteristic may have a delay reduction of 8.1% when Vdd 222 increases from 0.75 to 0.85 V, while the gate-dominated delay characteristic may have a delay increase of 26% when Vdd 222 decreases from 0.85 to 0.75 V. Note that during overshoots AFLL 210 should not speed up any more than any other clocked logical path, and that during undershoots AFLL 210 should slow down more than any other clocked logical path. Because the AFLL frequency is modulated by Vdd 222, and the AFLL period may track delay through both gate and wire time-critical paths, the Ldi dt induced power-supply voltage noise may be alleviated.

Figure 4:
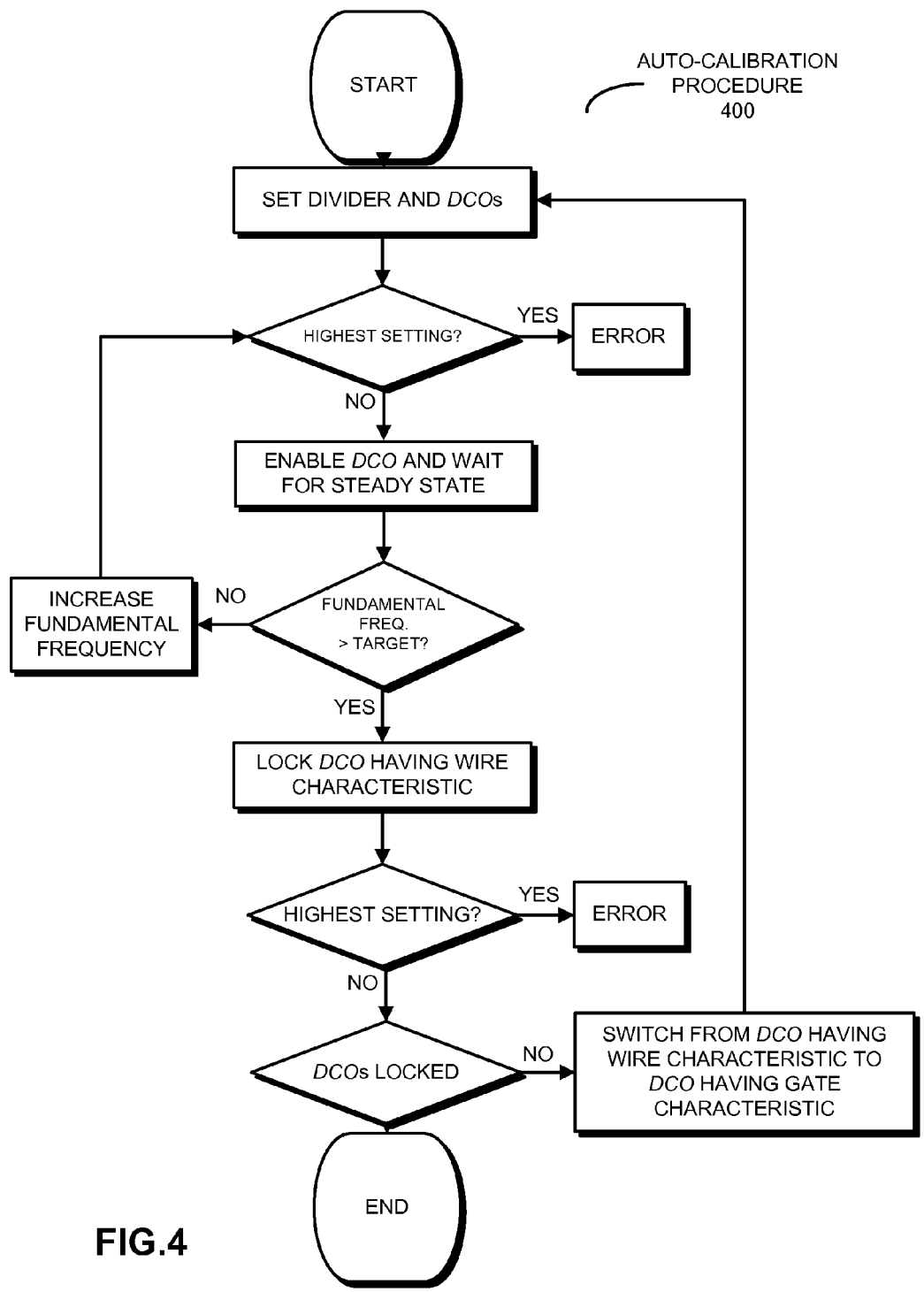
FIG. 4 is a flow diagram illustrating an auto-calibration procedure in accordance with an embodiment of the present disclosure.

In an exemplary embodiment, the auto-calibration procedure checks whether the fundamental frequency from a given DCO is within the upper frequency bound and the lower frequency bound of the DCO adjustable range. This is illustrated in FIG. 4, which presents a flow diagram illustrating auto-calibration procedure 400. First, a divider N in the feedback loop in the given feedback loop is set to a target fundamental frequency. Then, auto-calibration operation for the upper frequency bound is performed on the DCOs. In particular, the DCO with the wire-dominated delay characteristic is set to the lowest frequency setting, and the other DCO with the gate-dominated delay characteristic is set to the highest frequency setting. If both DCOs are set to the highest frequency setting, then an error is reported. Moreover, initially the DCO having the wire-dominated delay characteristic is enabled with the lowest frequency setting, and the other DCO having the gate-dominated delay characteristic is disabled (as noted below, subsequently the auto-calibration operation is performed on the other DCO). After the feedback loop reaches steady state, the maximum frequency of N cycles is compared to the target fundamental frequency. If the target fundamental frequency is less than the maximum frequency, the DCO having the wire-dominated delay characteristic is set to a higher frequency setting, and the auto-calibration operation is repeated. Otherwise, the frequency setting for the DCO having the wire-dominated delay characteristic is stored.

Next, a locking procedure is performed. First, the feedback loop for the DCO having the wire-dominated delay characteristic is enabled. After the frequency setting converges, the setting is stored. If this value exceeds the maximum value, an error is reported. Otherwise, the preceding operations in the locking procedure are repeated with the DCO having the gate-dominated delay characteristic switched with the DCO having the wire-dominated delay characteristic. Then, the settings for the DCO having the wire-dominated delay characteristic and the DCO having the gate-dominated delay characteristic are stored. Note that the auto-calibration procedure and the locking procedure may be repeated each time the AFLLs are switched.

In some embodiments, AFLL 210 includes at least one switched capacitor network that specifies a relative delay of DCO 212-1 and DCO 212-2. During the auto-calibration procedure, control logic 220 may adjust the switched capacitor network so that DCO 212-1 and DCO 212-2 have the same dynamic range. For example, control logic 220 may adjust the capacitive load on each stage in a DCO delay line.

Figure 5:
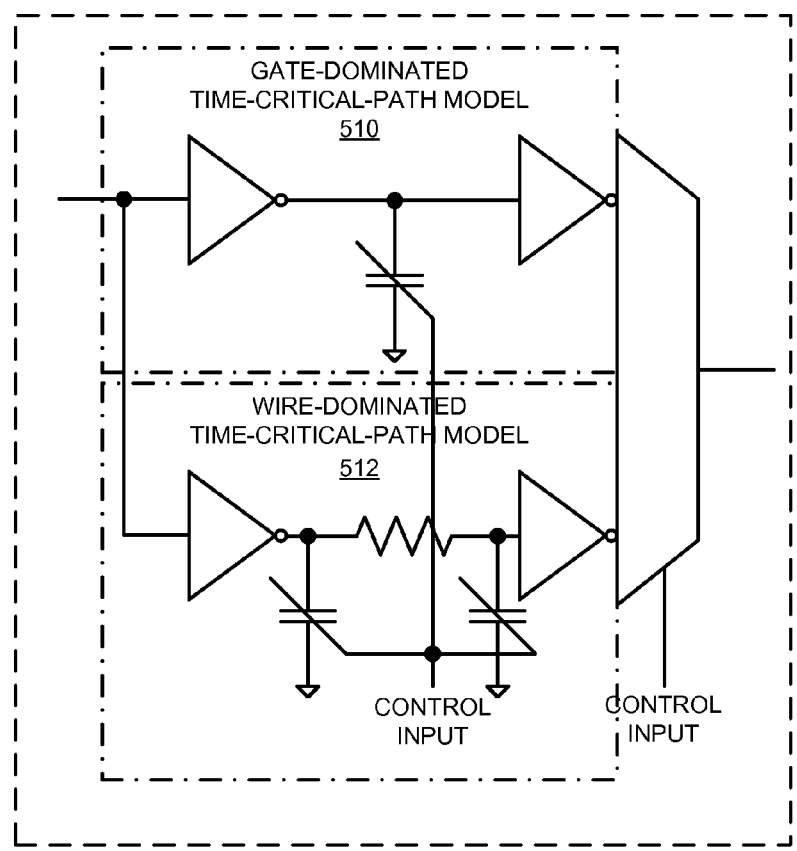
FIG. 5 is a block diagram illustrating a digitally controlled oscillator (DCO) in the integrated circuit of FIG. 2 in accordance with an embodiment of the present disclosure.

FIG. 5 presents a block diagram illustrating a DCO 500, such as one of DCOs 212 in integrated circuit 200 (FIG. 2). This DCO may include a gate-dominated time-critical-path model 510 and a wire-dominated time-critical-path model 512. Each of these models may include a switched capacitor network. DCO 500 may receive control inputs from a loop filter in control logic 220 (FIG. 2) to adjust the fundamental frequency of the DCO ring oscillator. In addition, the control inputs to each of the time-critical-path models may include adjustment bits that specify how the DCO ring oscillator tracks the response of time-critical path 224 (FIG. 2) to changes in Vdd 222 in FIG. 2. For example, the adjustment bits may specify capacitor-load values of the switched capacitor networks. Thus, DCO 500 may have a selectable delay characteristic that can be varied (in discrete steps) by control logic 220 (FIG. 2), which specifies a delay sensitivity of DCO 500 as a function of Vdd 222 (FIG. 2), thereby approximately matching and allowing compensation for the manufactured delay characteristic of time-critical path 224 (FIG. 2).

In an exemplary embodiment, an instance of the AFLL is placed near the center of the die to minimize the worst case mistrack between the AFLL and the farthest time-critical path. This AFLL may be the clock generator for the core clock domain which may include processor cores and L3 memory, and which is located at the root of core global clock-distribution tree. Other portions of integrated circuit 200 (FIG. 2), such as a serializer/deserializer, input/output circuits, or a system-on-chip, may be in another clock domain that is synchronized with clock signal 208 (FIG. 2) using a synchronizer circuit at a time-domain boundary (or time-domain crossing) between these clock domains. In particular, the synchronizer circuit may synchronize the signals crossing the time-domain boundary with a phase of a clock in the destination time domain. Note that, because there is an asynchronous boundary between the core clock domain and the other clock domain, phase locking of clock signal 208 (FIG. 2) and system clock 230 (FIG. 2) may not be needed in integrated circuit 200 (FIG. 2), which may allow optional feedback loop 226-1 (FIG. 2) and optional feedback loop 226-2 (FIG. 2) to be used.

Figure 6:
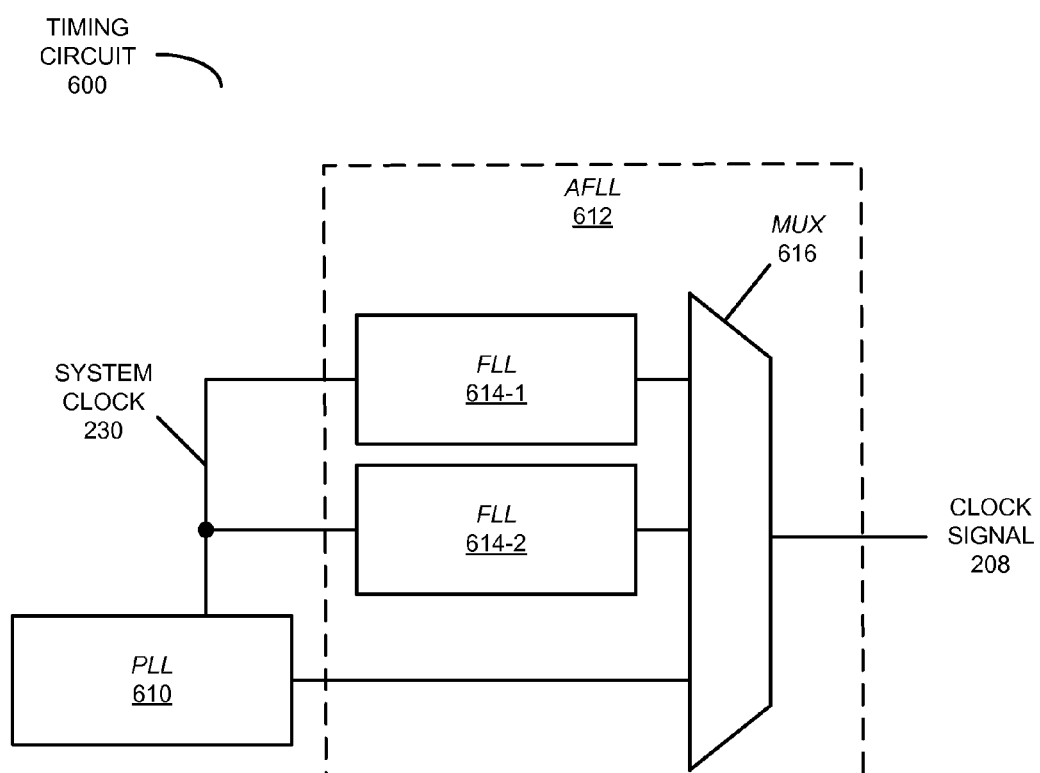
FIG. 6 is a block diagram illustrating a timing circuit in the integrated circuit of FIG. 2 in accordance with an embodiment of the present disclosure.
Figure 7:
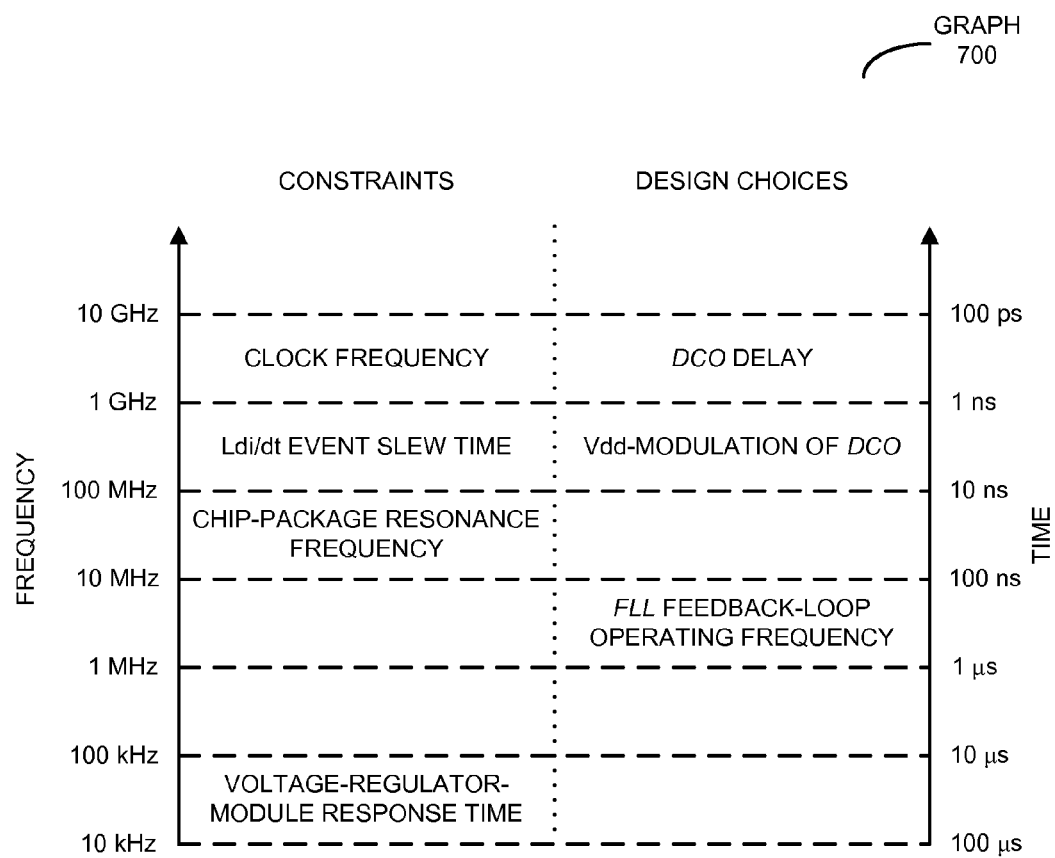
FIG. 7 is a graph illustrating constraints and design choices in the integrated circuit of FIG. 2 in accordance with an embodiment of the present disclosure.

In some embodiments, one or more PLLs may be used instead of the FLLs at certain frequencies. In particular, the one or more PLLs may be used at low frequencies and the FLLs may be used at the highest frequencies. As shown in FIG. 6, which presents a block diagram illustrating timing circuit 600 in integrated circuit 200 (FIG. 2), FLL or PLL feedback control may be selected based on the frequency of the power-supply variation(s) and/or the type of workload. In particular, the appropriate generating element (a PLL or an FLL) may be selected using multiplexer (MUX) 616. Thus, in some embodiments timing circuit 600 includes: a PLL 610, two PLLs, and/or FLLs 614 in AFLL 612 (which typically have the best performance and noise immunity, especially for a high-speed workload), and/or all of the above components in different modes. For example, the appropriate component(s) may be selected by control logic 220 and/or control logic 228 (FIG. 2) based on the workload (frequency, power consumption, etc.). FIG. 7 presents a graph 700 illustrating constraints and design choices in integrated circuit 200 (FIG. 2) including the relationship between frequency and the power-supply-variation feedback-control system.

Referring back to FIG. 2, in some embodiments integrated circuit 200 implements dynamic voltage and frequency scaling (DVFS). In particular, hardware and/or software features may enable real-time tradeoffs between power consumption and performance by varying the core operating frequency and power-supply voltage(s). For the purposes of DVFS, the performance state (p-state) of the integrated circuit 200, which refers to supported frequency and Vdd voltage pair, may increase or decrease. For example, in one p-state the operating fundamental frequency is first decreased and then Vdd 222 is decreased. Alternatively, in another p-state Vdd 222 is decreased, and then the operating fundamental frequency is decreased. Note that either of these DVFS operations may be equivalent to low-frequency package resonance noise with positive magnitude. Also note that low-frequency package resonance noise may be handled by the auto-calibration-operation locking procedure.

Figure 8:
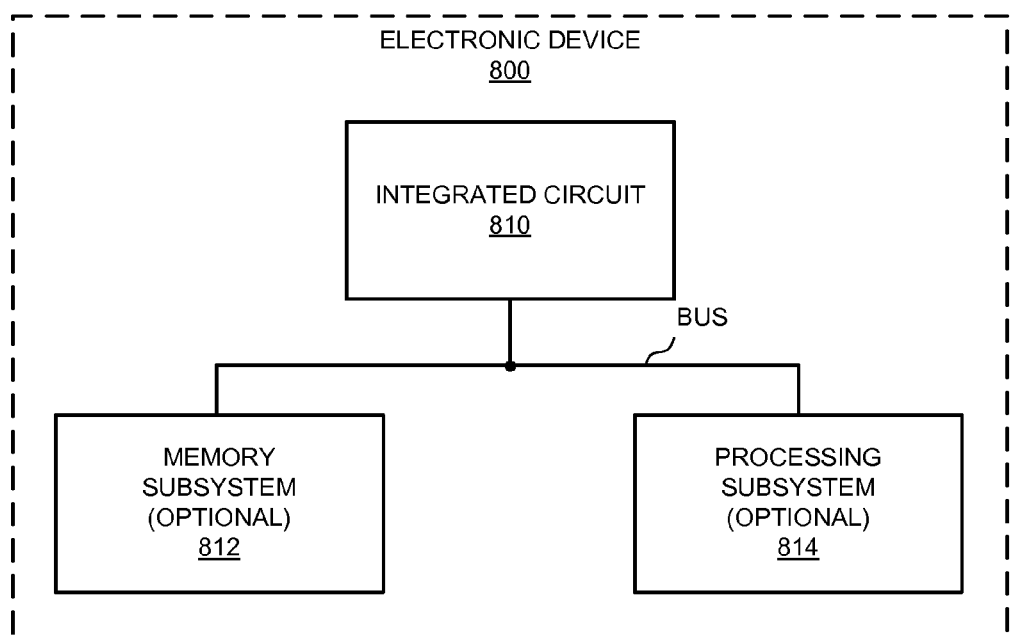
FIG. 8 is a block diagram of an electronic device that includes an integrated circuit in accordance with an embodiment of the present disclosure.

We now describe embodiments of an electronic device that includes one of the preceding embodiments of the integrated circuit, such as integrated circuit 200 (FIG. 2). FIG. 8 presents a block diagram of an electronic device 800 that includes integrated circuit 810. Furthermore, electronic device 800 may include one or more program modules or sets of instructions stored in an optional memory subsystem 812 (such as DRAM, another type of volatile or non-volatile computer-readable memory, and more generally a memory), which may be executed by an optional processing subsystem 814 (which may include one or more processors). Note that the one or more computer programs may constitute a computer-program mechanism. Furthermore, instructions in the various modules in optional memory subsystem 812 may be implemented in: a high-level procedural language, an object-oriented programming language, and/or in an assembly or machine language. Note that the programming language may be compiled or interpreted, e.g., configurable or configured, to be executed by optional processing subsystem 814.

More generally, embodiments of the integrated circuit may be used in a variety of applications, including: VLSI circuits, communication systems, storage area networks, data centers, networks (such as local area networks), and/or computer systems (such as multiple-core processor computer systems). Note that electronic device 800 may include, but is not limited to: a server, a laptop computer, a communication device or system, a tablet computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

The preceding embodiments may include fewer components or additional components. For example, in some embodiments DCO 212-1 in FIG. 2 is powered by a regulated voltage that is other than Vdd 222 (and, thus, may be less sensitive or insensitive to variations in Vdd 222). Although these embodiments are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. For example, control logic 220 and 228 may be combined in FIG. 2. Furthermore, note that circuits in these embodiments may be implemented using PMOS and/or NMOS, and signals may include digital signals that have approximately discrete values and/or analog signals that have continuous values. Thus, the control inputs or signals provided to DCOs 212 (FIG. 2) by control logic 220 (FIG. 2) may be digital signals and/or analog signals.

Figure 9:
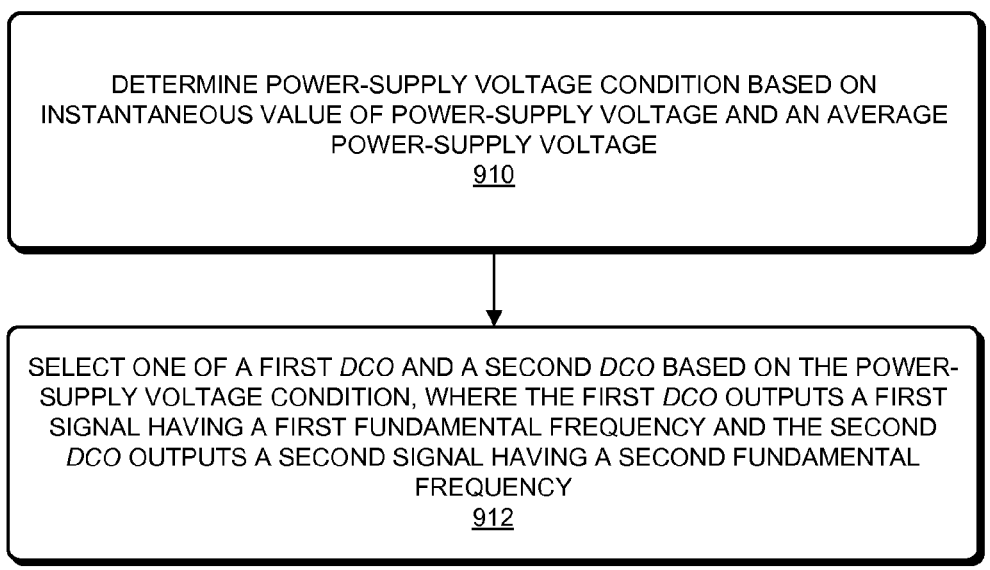
FIG. 9 is a flow chart illustrating a method for operating an AFLL that provides a clock signal in accordance with an embodiment of the present disclosure.

We now describe embodiments of the method. FIG. 9 presents a flow chart illustrating a method 900 for operating an AFLL (such as AFLL 210 in FIG. 2) that provides a clock signal. During operation, the AFLL determines a power-supply voltage condition based on an instantaneous value of a power-supply voltage and an average power-supply voltage (operation 910). Then, the AFLL selects one of a first DCO and a second DCO in the AFLL based on the power-supply voltage condition, where the first DCO outputs a first signal having a first fundamental frequency and the second DCO outputs a second signal having a second fundamental frequency (operation 912). Note that the second fundamental frequency is less than the first fundamental frequency, and the selected DCO reduces an impact of power-supply voltage variations on a time-critical path in an integrated circuit that includes the AFLL.

In some embodiments of method 900, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising a first sub-frequency-locked loop in an asymmetric frequency-locked loop (AFLL) configured to provide a clock signal, wherein the first sub-frequency-locked loop includes:
   a first digitally controlled oscillator (DCO) configured to output a first signal having a first fundamental frequency;
   a second DCO configured to output a second signal having a second fundamental frequency, wherein the second fundamental frequency is less than the first fundamental frequency; and
   at least one control logic configured to select one of the first DCO and the second DCO based on an instantaneous value of a power-supply voltage and an average power-supply voltage, wherein the selected DCO reduces an impact of power-supply voltage variations on a time-critical path in the integrated circuit.

2. The integrated circuit of claim 1, wherein the control logic is configured to select the first DCO if the instantaneous value of the power-supply voltage is greater than the average power-supply voltage; and wherein the control logic is configured to select the second DCO if the instantaneous value of the power-supply voltage is less than the average power-supply voltage.

3. The integrated circuit of claim 1, wherein the selected DCO prevents timing failures on the time-critical path associated with power-supply voltage droop without reducing the period of the clock signal during power-supply voltage overshoot.

4. The integrated circuit of claim 1, wherein the integrated circuit further includes a second sub-frequency-locked loop in the AFLL;

wherein, during a given time interval, one of the first sub-frequency-locked loop and the second sub-frequency-locked loop is enabled; and wherein, during successive time intervals, the integrated circuit is configured to alternate operation between the first sub-frequency-locked loop and the second sub-frequency-locked loop.

5. The integrated circuit of claim 4, wherein the integrated circuit is configured to perform an auto-calibration procedure; and wherein, during the auto-calibration procedure of a given instance of the sub-frequency-locked loop, which can include one of the first sub-frequency-locked loop and the second sub-frequency-locked loop, the control logic is configured to:

adjust a delay in at least one of the first DCO and the second DCO so that the first DCO and the second DCO have the same dynamic range; and ensure that, at the average power-supply voltage, the first DCO and the second DCO are locked to the same target frequency so that, at the average power-supply voltage, the first fundamental frequency approximately equals the second fundamental frequency.

6. The integrated circuit of claim 5, wherein the AFLL further includes a first feedback loop that includes the first DCO and a second feedback loop that includes the second DCO;

wherein, during the auto-calibration procedure, the control logic is configured to enable the first feedback loop and the second feedback loop; and wherein, during normal operation, the control logic is configured to disable the first feedback loop and the second feedback loop so that a selected DCO operates open loop.

7. The integrated circuit of claim 6, wherein a given feedback loop, which can include one of the first feedback loop and the second feedback loop, includes a DCO associated with a time-critical path having a wire-dominated delay characteristic, and another DCO associated with a time-critical path having a gate-dominated delay characteristic; and wherein, during the auto-calibration procedure, the control logic is configured to select one of the DCO and the other DCO.

8. The integrated circuit of claim 5, wherein, after the auto-calibration procedure, the first DCO has approximately the same delay as the second DCO at the average power-supply voltage.

9. The integrated circuit of claim 5, wherein the AFLL further includes at least one switched capacitor network that specifies a relative delay of the first DCO and the second DCO; and wherein, during the auto-calibration procedure, the control logic is configured to adjust the switched capacitor network so that the first DCO and the second DCO have the same dynamic range.

10. The integrated circuit of claim 1, wherein the power-supply voltage variations are associated with an inductance of the chip package that includes the integrated circuit and a time varying power-supply current.

11. An electronic device, comprising:

a processor;

a memory storing a program module that is configured to be executed by the processor; and an integrated circuit, wherein the integrated circuit includes a first sub-frequency-locked loop in an asymmetric frequency-locked loop (AFLL) configured to provide a clock signal, wherein the first sub-frequency-locked loop includes:

a first digitally controlled oscillator (DCO) configured to output a first signal having a first fundamental frequency;

a second DCO configured to output a second signal having a second fundamental frequency, wherein the second fundamental frequency is less than the first fundamental frequency; and at least one control logic configured to select one of the first DCO and the second DCO based on an instantaneous value of a power-supply voltage and an average power-supply voltage, wherein the selected DCO reduces an impact of power-supply voltage variations on a time-critical path in the integrated circuit.

12. The electronic device of claim 11, wherein the control logic is configured to select the first DCO if the instantaneous value of the power-supply voltage is greater than the average power-supply voltage; and wherein the control logic is configured to select the second DCO if the instantaneous value of the power-supply voltage is less than the average power-supply voltage.

13. The electronic device of claim 11, wherein the selected DCO prevents timing failures on the time-critical path associated with power-supply voltage droop without reducing the period of the clock signal during power-supply voltage overshoot.

14. The electronic device of claim 11, wherein the integrated circuit further includes a second sub-frequency-locked loop;

wherein, during a given time interval, one of the first sub-frequency-locked loop and a second sub-frequency-locked loop is enabled; and wherein, during successive time intervals, the integrated circuit is configured to alternate operation between the first sub-frequency-locked loop and the second sub-frequency-locked loop.

15. The electronic device of claim 14, wherein the integrated circuit is configured to perform an auto-calibration procedure; and wherein, during the auto-calibration procedure of a given instance of the sub-frequency-locked loop, which can include one of the first sub-frequency-locked loop and the second sub-frequency-locked loop, the control logic is configured to:

adjust a delay in at least one of the first DCO and the second DCO so that the first DCO and the second DCO have the same dynamic range; and ensure that, at the average power-supply voltage, the first DCO and the second DCO are locked to the same target frequency so that, at the average power-supply voltage, the first fundamental frequency approximately equals the second fundamental frequency.

16. The electronic device of claim 15, wherein the AFLL further includes a first feedback loop that includes the first DCO and a second feedback loop that includes the second DCO;

wherein, during the auto-calibration procedure, the control logic is configured to enable the first feedback loop and the second feedback loop; and wherein, during normal operation, the control logic is configured to disable the first feedback loop and the second feedback loop so that a selected DCO operates open loop.

17. The electronic device of claim 15, wherein, after the auto-calibration procedure, the first DCO has approximately the same delay as the second DCO at the average power-supply voltage.

18. The electronic device of claim 15, wherein the AFLL further includes at least one switched capacitor network that specifies a relative delay of the first DCO and the second DCO; and wherein, during the auto-calibration procedure, the control logic is configured to adjust the switched capacitor network so that the first DCO and the second DCO have the same dynamic range.

19. The electronic device of claim 11, wherein the power-supply voltage variations are associated with an inductance of the chip package that includes the integrated circuit and a time varying power-supply current.

20. A method for operating an AFLL that provides a clock signal, the method comprising:

determining a power-supply voltage condition based on an instantaneous value of a power-supply voltage and an average power-supply voltage; and selecting one of a first DCO and a second DCO in the AFLL based on the power-supply voltage condition, wherein the first DCO outputs a first signal having a first fundamental frequency and the second DCO outputs a second signal having a second fundamental frequency;

wherein the second fundamental frequency is less than the first fundamental frequency; and wherein the selected DCO reduces an impact of power-supply voltage variations on a time-critical path in an integrated circuit that includes the AFLL.

* * * * *

UNITED STATES PATENT AND TRADEMARK OFFICE
CERTIFICATE OF CORRECTION

Page 1 of 1

PATENT NO. : 8,604,852 B1
APPLICATION NO. : 13/610469
DATED : December 10, 2013
INVENTOR(S) : Turullols et al.

It is certified that error appears in the above-identified patent and that said Letters Patent is hereby corrected as shown below:

In the Specification

In column 7, line 32, delete "Ldi dt" and insert -- Ldi/dt --, therefor.

Signed and Sealed this
Fifteenth Day of July, 2014

Michelle K. Lee
*Deputy Director of the United States Patent and Trademark Office*